United States Patent
Taniguchi et al.

(10) Patent No.: US 9,929,715 B2
(45) Date of Patent: Mar. 27, 2018

(54) ACOUSTIC WAVE DEVICE

(71) Applicant: TAIYO YUDEN CO., LTD., Tokyo (JP)

(72) Inventors: Shinji Taniguchi, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 356 days.

(21) Appl. No.: 14/275,597

(22) Filed: May 12, 2014

(65) Prior Publication Data
US 2014/0361664 A1    Dec. 11, 2014

(30) Foreign Application Priority Data

Jun. 10, 2013 (JP) ................................. 2013-122085

(51) Int. Cl.
*H03H 9/02* (2006.01)
*H03H 9/17* (2006.01)

(52) U.S. Cl.
CPC ........ H03H 9/02102 (2013.01); H03H 9/173 (2013.01); H03H 9/175 (2013.01)

(58) Field of Classification Search
CPC ..... H03H 9/173; H03H 9/175; H03H 9/02102
USPC ............................................. 310/313 R, 346
See application file for complete search history.

(56) References Cited

U.S. PATENT DOCUMENTS

| 4,456,850 | A | 6/1984 | Inoue et al. | |
|---|---|---|---|---|
| 6,420,820 | B1 | 7/2002 | Larson, III | |
| 2002/0038989 | A1* | 4/2002 | Larson, III | H03H 3/04 310/330 |
| 2004/0113720 | A1* | 6/2004 | Komuro | H03H 3/04 333/133 |
| 2005/0093653 | A1 | 5/2005 | Larson, III | |
| 2005/0093654 | A1 | 5/2005 | Larson, III et al. | |
| 2005/0093655 | A1 | 5/2005 | Larson, III et al. | |
| 2005/0093656 | A1 | 5/2005 | Larson, III et al. | |
| 2005/0218754 | A1 | 10/2005 | Yokoyama et al. | |

(Continued)

FOREIGN PATENT DOCUMENTS

| CN | 1677852 A | 10/2005 |
|---|---|---|
| CN | 1902819 A | 1/2007 |

(Continued)

OTHER PUBLICATIONS

NPL Material Parameters.*

(Continued)

*Primary Examiner* — Bryan Gordon
(74) *Attorney, Agent, or Firm* — Chen Yoshimura LLP

(57) ABSTRACT

An acoustic wave device includes: a piezoelectric film located on a substrate; a lower electrode and an upper electrode facing each other across the piezoelectric film; a temperature compensation film located on a surface, which is opposite to the piezoelectric film, of at least one of the lower electrode and the upper electrode and having a temperature coefficient of elastic constant opposite in sign to a temperature coefficient of elastic constant of the piezoelectric film; and an additional film located on a surface of the temperature compensation film opposite to the piezoelectric film and having an acoustic impedance greater than an acoustic impedance of the temperature compensation film.

11 Claims, 16 Drawing Sheets

(56) References Cited

U.S. PATENT DOCUMENTS

| | | | |
|---|---|---|---|
| 2007/0120625 A1* | 5/2007 | Larson, III | H03H 3/04 333/189 |
| 2007/0222336 A1* | 9/2007 | Grannen | H03H 3/04 310/320 |
| 2008/0129417 A1* | 6/2008 | Taniguchi | H03H 3/04 333/192 |
| 2010/0096358 A1 | 4/2010 | Taniguchi et al. | |
| 2010/0117762 A1* | 5/2010 | Taniguchi | H03H 3/02 333/187 |
| 2010/0148636 A1* | 6/2010 | Nishihara | H03H 9/02015 310/365 |
| 2010/0327701 A1* | 12/2010 | Grannen | H03H 3/04 310/346 |
| 2011/0266925 A1 | 11/2011 | Ruby et al. | |
| 2012/0200373 A1* | 8/2012 | Taniguchi | H03H 9/02086 333/189 |
| 2013/0033151 A1 | 2/2013 | Ueda et al. | |
| 2013/0033337 A1 | 2/2013 | Nishihara et al. | |
| 2013/0038405 A1 | 2/2013 | Taniguchi et al. | |
| 2013/0181579 A1* | 7/2013 | Shin | H01L 41/107 310/346 |

FOREIGN PATENT DOCUMENTS

| | | |
|---|---|---|
| CN | 102916674 A | 2/2013 |
| JP | 58-137317 A | 8/1983 |
| JP | 60-16010 A | 1/1985 |
| JP | 2004-193929 A | 7/2004 |
| JP | 2006-109472 A | 4/2006 |
| JP | 2006-295380 A | 10/2006 |
| JP | 2013-34130 A | 2/2013 |
| JP | 2013-38471 A | 2/2013 |
| JP | 2013-38658 A | 2/2013 |

OTHER PUBLICATIONS

Chinese Office Action dated Jul. 28, 2016, in a counterpart Chinese patent application No. 201410255261.8.

Japanese Office Action dated Apr. 25, 2017, in a counterpart Japanese patent application No. 2013-122085.

Chinese Office Action dated Mar. 3 2017, in a counterpart Chinese patent application No. 201410255261.8. (Partial translation of the Office Action is attached as a concise explanation of relevance.).

* cited by examiner

ACOUSTIC WAVE DEVICE

CROSS-REFERENCE TO RELATED APPLICATION

This application is based upon and claims the benefit of priority of the prior Japanese Patent Application No. 2013-122085, filed on Jun. 10, 2013, the entire contents of which are incorporated herein by reference.

FIELD

A certain aspect of the present invention relates to an acoustic wave device.

BACKGROUND

Piezoelectric thin film resonators using a Bulk Acoustic Wave (BAW) are used for filters and duplexers of wireless devices such as mobile phones. The piezoelectric thin film resonator has a structure designed to have a lower electrode and an upper electrode facing each other across a piezoelectric film. A region in which the lower electrode and the upper electrode face each other across the piezoelectric film is a resonance region. The piezoelectric film of the piezoelectric thin film resonator generally has a negative temperature coefficient of elastic constant. Therefore, the resonant frequency of the piezoelectric thin film resonator is shifted to a low frequency side as temperature increases. As described above, in an acoustic wave device using the piezoelectric thin film resonator, the resonant frequency, the anti-resonant frequency, and the passband change due to temperature.

To suppress the frequency change due to temperature, there has been suggested piezoelectric thin film resonators using an insulating film with a temperature coefficient of elastic constant opposite in sign to that of the piezoelectric film as a temperature compensation film as disclosed in Japanese Patent Application Publication Nos. 58-137317, 2013-38471, 2013-34130, and 2013-38658. To suppress a decrease in electromechanical coupling coefficient caused by the use of the temperature compensation film, there has been suggested piezoelectric thin film resonators including short-circuited conductive films formed on the upper and lower surfaces of a temperature compensation film and piezoelectric thin film resonators including a temperature compensation film embedded in the lower electrode or the upper electrode as disclosed in Japanese Patent Application Publication No. 60-16010, US Patent Application Publication No. 2011/0266925, and U.S. Pat. No. 6,420,820. Additionally, there has been known that resonance characteristics degrade when the peripheral portion of the electrode in the resonance region is thinner than a center portion as disclosed in Japanese Patent Application Publication No. 2006-109472.

When a temperature compensation film is located in the piezoelectric film to suppress the frequency change due to temperature, the electromechanical coupling coefficient decreases. When a temperature compensation film is embedded in the lower electrode or the upper electrode, electrodes on the upper and lower surfaces of the temperature compensation film are short-circuited, and thus the peripheral portion of the lower electrode or the upper electrode in the resonance region is thinner than the center portion, and resonance characteristics degrade as disclosed in Japanese Patent Application Publication No. 2006-109472.

SUMMARY OF THE INVENTION

According to an aspect of the present invention, there is provided an acoustic wave device including: a piezoelectric film located on a substrate; a lower electrode and an upper electrode facing each other across the piezoelectric film; a temperature compensation film located on a surface, which is opposite to the piezoelectric film, of at least one of the lower electrode and the upper electrode and having a temperature coefficient of elastic constant opposite in sign to a temperature coefficient of elastic constant of the piezoelectric film; and an additional film located on a surface of the temperature compensation film opposite to the piezoelectric film and having an acoustic impedance greater than an acoustic impedance of the temperature compensation film.

DETAILED DESCRIPTION

Hereinafter, a description will be given of embodiments of the present invention with reference to the attached drawings.

First Embodiment

Figure 1A:
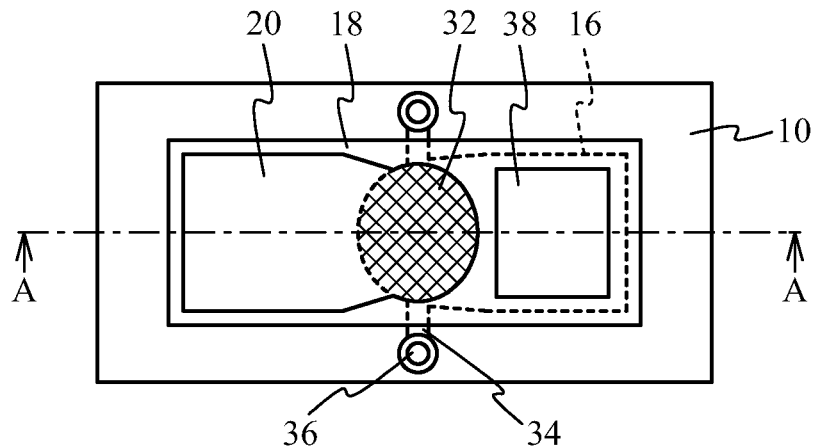
FIG. 1A is a top view illustrating a piezoelectric thin film resonator in accordance with a first embodiment.
Figure 1B:
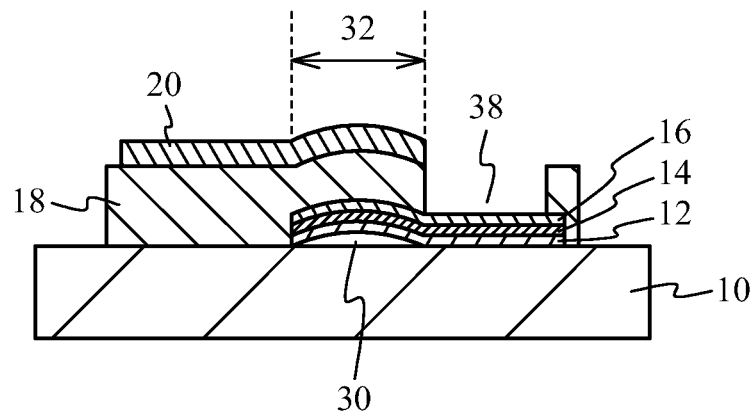
FIG. 1B is a cross-sectional view taken along line A-A in FIG. 1A.
Figure 1C:
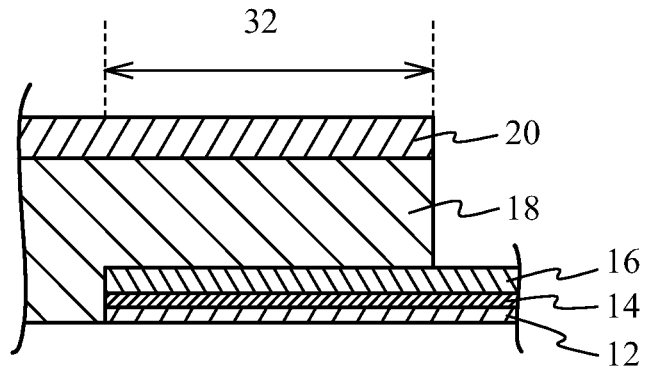
FIG. 1C is an enlarged schematic cross-sectional view of a resonance region.

A first embodiment describes a piezoelectric thin film resonator having an FBAR (Film Bulk Acoustic Resonator) structure employed in an acoustic wave device such as a filter. FIG. 1A is a top view illustrating a piezoelectric thin film resonator in accordance with the first embodiment, FIG. 1B is a cross-sectional view taken along line A-A in FIG. 1A, and FIG. 1C is an enlarged schematic cross-sectional view of a resonance region. As illustrated in FIG. 1A through FIG. 1C, an additional film 12 is located on a substrate 10 made of, for example, a silicon (Si) substrate so that an air-space 30 having a dome-shaped bulge is formed between the additional film 12 and the upper surface of the substrate 10. The dome-shaped bulge has a shape in which the height of the air-space 30 is low in the periphery of the air-space 30 and the height of the air-space 30 increases at closer distance to the center of the air-space 30.

A temperature compensation film 14 is located on the additional film 12. A lower electrode 16 is located on the temperature compensation film 14. The additional film 12, the temperature compensation film 14, and the lower electrode 16 have the same shape. The additional film 12 has an acoustic impedance greater than that of the temperature compensation film 14. The additional film 12 is, for example, a metal film formed by stacking a chrome (Cr) film and a ruthenium (Ru) film in this order from the substrate 10 side. The temperature compensation film 14 has a temperature coefficient of elastic constant opposite in sign to that of a piezoelectric film 18. The temperature compensation film 14 is, for example, a silicon oxide film to which fluorine is added (an SiOF film). The lower electrode 16 is made of, for example, a Ru film. The temperature compensation film 14 is located between the additional film 12 and the lower electrode 16, and thereby the additional film 12 and the lower electrode 16 do not make contact with each other and are not short-circuited. Accordingly, the additional film 12 does not electrically contribute to the excitation of the acoustic wave.

The piezoelectric film 18 made of aluminum nitride (AlN) having a main axis in a (002) direction is located on the lower electrode 16 and the substrate 10. An upper electrode 20 is located on the piezoelectric film 18 so as to have a region (a resonance region 32) facing the lower electrode 16. The resonance region 32 is a region having an elliptical shape and in which the acoustic wave in a thickness extension mode resonates. The upper electrode 20 is made of, for example, a metal film formed by stacking a Ru film and a Cr film in this order from the piezoelectric film 18 side.

An introduction path 34 for etching a sacrifice layer is formed in a stacked portion in which the additional film 12, the temperature compensation film 14, and the lower electrode 16 are stacked. The sacrifice layer is a layer for forming the air-space 30. The piezoelectric film 18 does not cover the vicinity of the tip of the introduction path 34, and the stacked portion has a hole portion 36 at the tip of the introduction path 34. An aperture 38 for providing an electrical connection to the lower electrode 16 is formed in the piezoelectric film 18. An underlayer for bumps made of gold (Au) for external connection may be located on the lower electrode 16 located at the bottom of the aperture 38.

The substrate 10 may be a quartz substrate, a glass substrate, a ceramic substrate, or a gallium arsenide (GaAs) substrate instead of a Si substrate. The lower electrode 16 and the upper electrode 20 may be made of a single-layer film of aluminum (Al), titanium (Ti), copper (Cu), molybdenum (Mo), tungsten (W), tantalum (Ta), platinum (Pt), rhodium (Rh), or iridium (Ir) or a multilayered film of them instead of Ru and Cr.

The piezoelectric film 18 may be made of zinc oxide (ZnO), lead zirconate titanate (PZT), or lead titanate (PbTiO$_3$) instead of AlN. In addition, the piezoelectric film 18 mainly contains AlN, and may contain other elements to improve resonance characteristics or piezoelectricity. For example, the use of scandium (Sc) as an additive element improves the piezoelectricity of the piezoelectric film 18, and improves the effective electromechanical coupling coefficient of the piezoelectric thin film resonator.

The temperature compensation film 14 has a temperature coefficient of elastic constant opposite in sign to that of the piezoelectric film 18 to improve temperature characteristics. For example, the piezoelectric film 18 has a negative temperature coefficient of elastic constant when made of AlN. Therefore, a material with a positive temperature coefficient of elastic constant such as an SiOF film is used as the temperature compensation film 14. Instead of SiOF, a material with a positive temperature coefficient of elastic constant can be used, and an insulating film such as a silicon oxide film, a silicon nitride film, or a germanium oxide film may be used. The aforementioned films may not have a stoichiometric composition. Additionally, the temperature compensation film 14 may be an insulating film mainly containing silicon oxide, silicon nitride, or germanium oxide, and containing other elements to improve resonance characteristics or temperature characteristics such as an SiOF film. For example, the temperature compensation film 14 mainly contains silicon oxide, and one or more of fluorine (F), hydrogen (H), CH$_3$, CH$_2$, chlorine (Cl), carbon (C), nitrogen (N), phosphorus (P), and sulfur (S) may be added. As described above, the use of a silicon oxide film to which other elements are added for the temperature compensation film allows the temperature compensation film 14 to have a high temperature-coefficient of elastic constant, and allows the film thickness of the temperature compensation film 14 to be reduced.

The additional film 12 has an acoustic impedance greater than that of the temperature compensation film 14. For example, when the temperature compensation film 14 is made of an SiOF film, the additional film 12 can be made of a Ru film, a Cr film, a multilayered film of Ru and Cr, an aluminum nitride (AlN) film, or an aluminum oxide ($Al_2O_3$). As described above, a material same as the material included in the lower electrode 16, the upper electrode 20, or the piezoelectric film 18 may be selected for the additional film 12.

FIG. 2A through FIG. 3C are schematic cross-sectional views illustrating a method of fabricating the piezoelectric thin film resonator in accordance with the first embodiment. The air-space 30 is formed by using a sacrifice layer to fabricate the piezoelectric thin film resonator illustrated in FIG. 1A through FIG. 1C. However, the following describes methods of forming the additional film 12, the temperature compensation film 14, the lower electrode 16, the piezoelectric film 18, and the upper electrode 20, and omits the description of other.

Figure 2A:
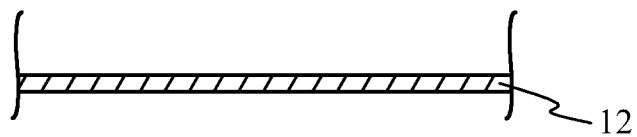
FIG. 2A through FIG. 2D are schematic cross-sectional views (No. 1) illustrating a method of fabricating the piezoelectric thin film resonator in accordance with the first embodiment.
Figure 2B:
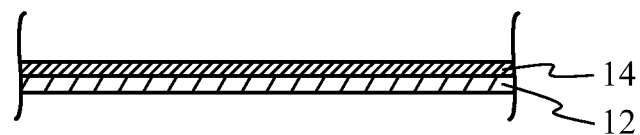
Figure 2C:
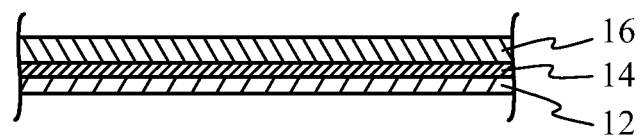

As illustrated in FIG. 2A, the additional film 12 is formed on the substrate 10. The additional film 12 is formed by, for example, sputtering, vacuum evaporation, or CVD (Chemical Vapor Deposition). As illustrated in FIG. 2B, the temperature compensation film 14 is formed on the additional film 12. The temperature compensation film 14 is formed by, for example, sputtering or CVD. As illustrated in FIG. 2C, the lower electrode 16 is formed on the temperature compensation film 14. The lower electrode 16 is formed by, for example, sputtering, vacuum evaporation, or CVD.

Figure 2D:
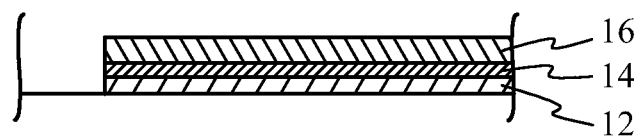

As illustrated in FIG. 2D, the additional film 12, the temperature compensation film 14, and the lower electrode 16 are integrally-patterned into a desired shape by photolithography and etching. As described above, the integrated processing of the additional film 12, the temperature compensation film 14, and the lower electrode 16 simplifies the fabrication process, and makes them have the same shape.

Figure 3A:
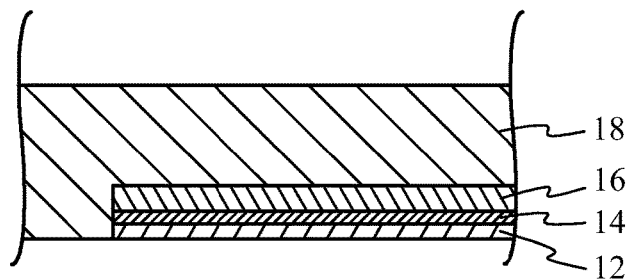
FIG. 3A through FIG. 3C are schematic cross-sectional views (No. 2) illustrating the method of fabricating the piezoelectric thin film resonator in accordance with the first embodiment.
Figure 3B:
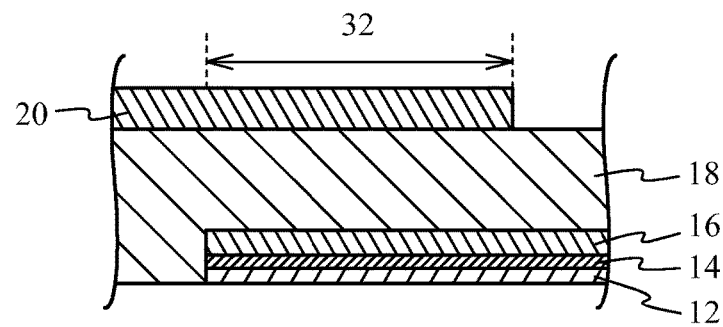

As illustrated in FIG. 3A, the piezoelectric film 18 is formed on the lower electrode 16 and the substrate 10. The piezoelectric film 18 is formed by, for example, sputtering, vacuum evaporation, or CVD. As illustrated in FIG. 3B, the upper electrode 20 is formed on the piezoelectric film 18. The upper electrode 20 is formed by, for example, sputtering, vacuum evaporation, or CVD. Then, the upper electrode 20 is patterned into a desired shape by photolithography and etching. This process forms the resonance region 32 in which the lower electrode 16 overlaps with the upper electrode 20.

Figure 3C:
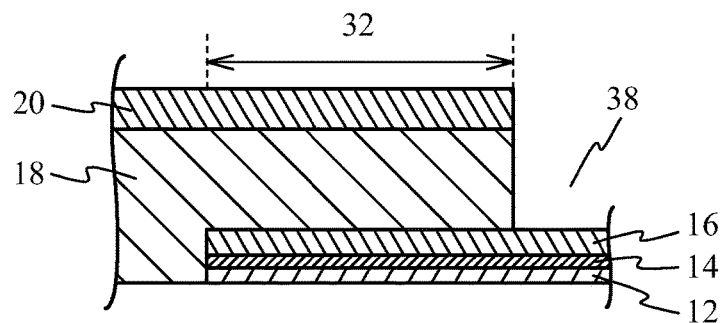

As illustrated in FIG. 3C, the piezoelectric film 18 is etched by using a photoresist (not illustrated) as an etching mask. This process forms the aperture 38 for providing an electrical connection to the lower electrode 16. The upper electrode 20 may be used as an etching mask instead of the photoresist. The piezoelectric film 18 is etched by wet etching or dry etching. When the piezoelectric film 18 is made of AlN, a solution including phosphoric acid may be used as an etching liquid for etching the piezoelectric film 18.

The piezoelectric thin film resonator of the first embodiment was fabricated, and temperature dependence of frequency was measured. The additional film 12 of the fabricated piezoelectric thin film resonator is a metal film formed by stacking a Cr film with a film thickness of 100 nm and a Ru film with a film thickness of 30 nm in this order from the substrate 10 side. The temperature compensation film 14 is an SiOF film with a film thickness of 135 nm and a density of F of 9 atm %. The lower electrode 16 is a Ru film with a film thickness of 130 nm. The piezoelectric film 18 is an AlN film with a film thickness of 1.2 µm. The upper electrode 20 is a metal film formed by stacking a Ru film with a film thickness of 210 nm and a Cr film with a film thickness of 40 nm in this order from the piezoelectric film 18 side. For comparison, fabricated was a piezoelectric thin film resonator of a first comparative example having the same structure as the first embodiment except that the temperature compensation film 14 is not formed, and temperature dependence of frequency thereof was measured.

Figure 4A:
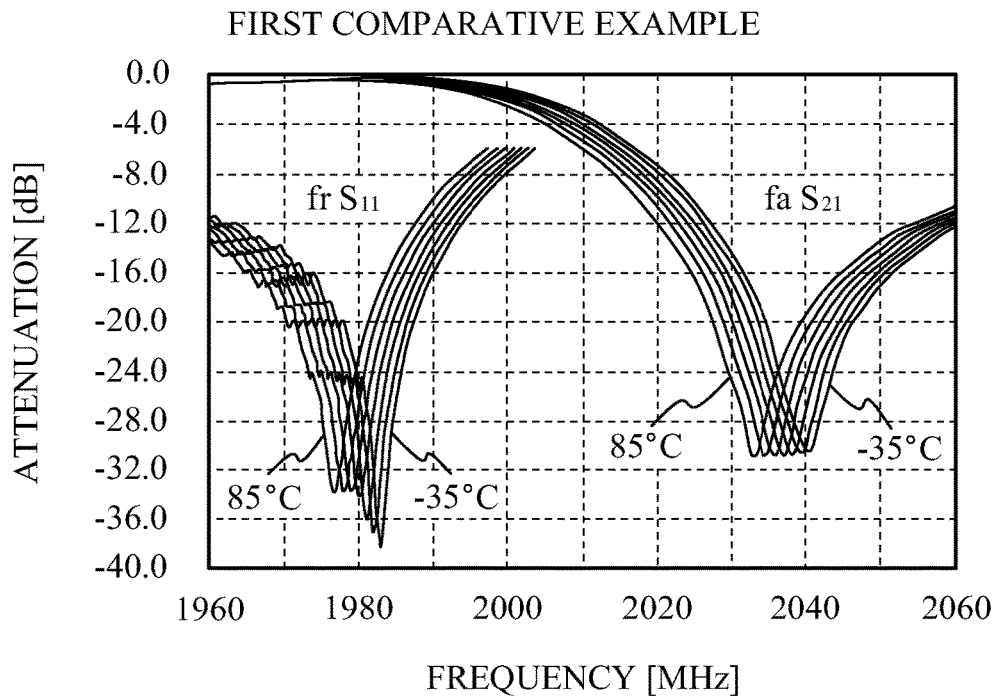
FIG. 4A and FIG. 4B are diagrams illustrating temperature dependence of resonant frequencies and anti-resonant frequencies of the piezoelectric thin film resonators in accordance with a first comparative example and the first embodiment.
Figure 4B:
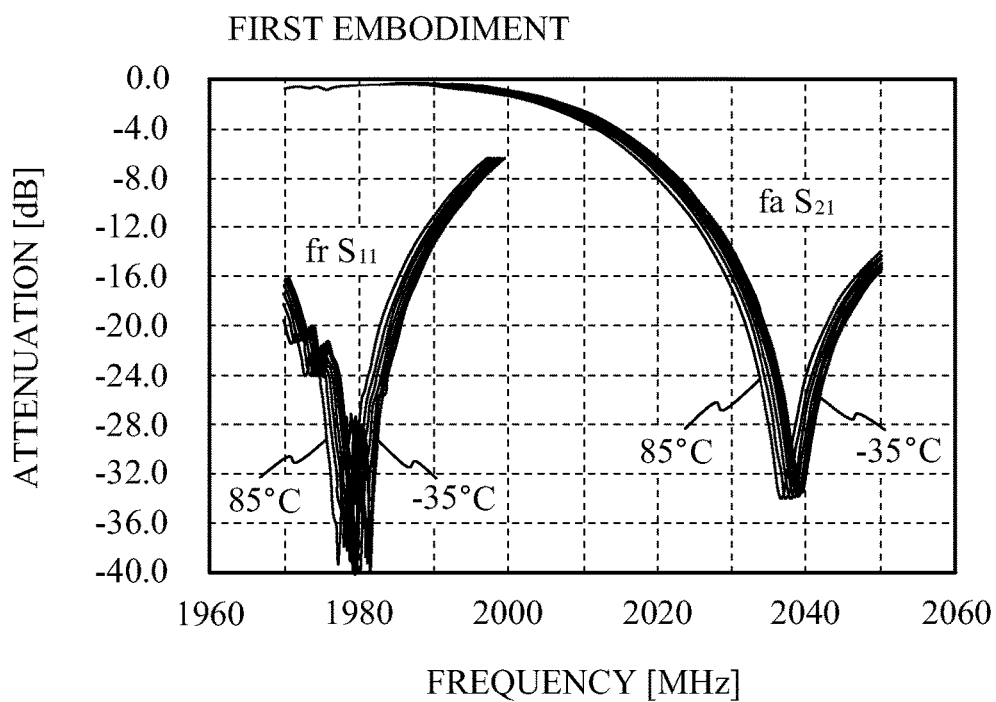

FIG. 4A and FIG. 4B are diagrams illustrating temperature dependence of the resonant frequencies and the anti-resonant frequencies of the piezoelectric thin film resonators of the first comparative example and the first embodiment. The resonant frequency fr is obtained by measuring reflection characteristics S11 of the piezoelectric thin film resonator. The anti-resonant frequency fa is obtained by measuring pass characteristics S21 of the piezoelectric thin film resonator. FIG. 4A and FIG. 4B illustrate measurement results of S11 and S21 of the piezoelectric thin film resonator when S11 and S21 were measured at 20° C. intervals from −35° C. to 85° C.

As illustrated in FIG. 4A, the piezoelectric thin film resonator of the first comparative example has a temperature coefficient of resonant frequency fr of −27.3 ppm/° C. and a temperature coefficient of anti-resonant frequency fa of −32.1 ppm/° C. On the other hand, as illustrated in FIG. 4B, the piezoelectric thin film resonator of the first embodiment has a temperature coefficient of resonant frequency fr of −11.6 ppm/° C. and a temperature coefficient of anti-resonant frequency fa of −10.5 ppm/° C. As described above, the temperature coefficient of the first embodiment increases by approximately 20 ppm/° C. compared to that of the first comparative example. The reason why the temperature coefficient of frequency is decreased in the first embodiment is because the temperature compensation film 14 with a temperature coefficient of elastic constant opposite in sign to that of the piezoelectric film 18 is located. As described above, the temperature dependence of the resonant frequency and the anti-resonant frequency can be reduced by locating the temperature compensation film 14 on the surface of the lower electrode 16 opposite to the piezoelectric film 18.

A description will next be given of a simulation that measures the Q value of the resonant frequency, the Q value of the anti-resonant frequency, and the electromechanical coupling coefficient of the piezoelectric thin film resonator of the first embodiment. Table 1 presents the materials and the film thicknesses of the layers of the piezoelectric thin film resonator used in the simulation. For comparison, the simulation is performed to a piezoelectric thin film resonator of a second comparative example not including the additional film 12. The film thicknesses of the additional film 12, the temperature compensation film 14, and the lower electrode 16 are adjusted so that samples 1 to 3 used in the simulation have the same temperature characteristics (a temperature coefficient of resonant frequency of approximately −10 ppm/° C.). In addition, a protective film is located on the upper electrode 20.

TABLE 1

| | | Protective film | Upper electrode | | Piezoelectric film | Lower electrode | Temperature compensation film | Additional film | |
|---|---|---|---|---|---|---|---|---|---|
| | | SiO$_2$ | Cr | Ru | AlN | Ru | SiOF | Ru | AlN |
| First Embodiment | Sample 1 | 50 | 40 | 200 | 1150 | 135 | 190 | 50 | — |
| | Sample 2 | 50 | 40 | 200 | 1150 | 135 | 190 | — | 181 |
| Second Comparative Example | Sample 3 | 50 | 40 | 200 | 1150 | 135 | 410 | — | — |

UNIT: nm

Figure 5A:
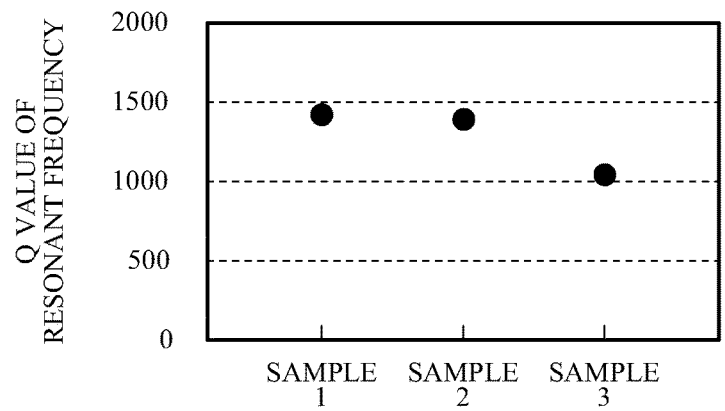
FIG. 5A illustrates simulation results of the Q value of the resonant frequency.
Figure 5B:
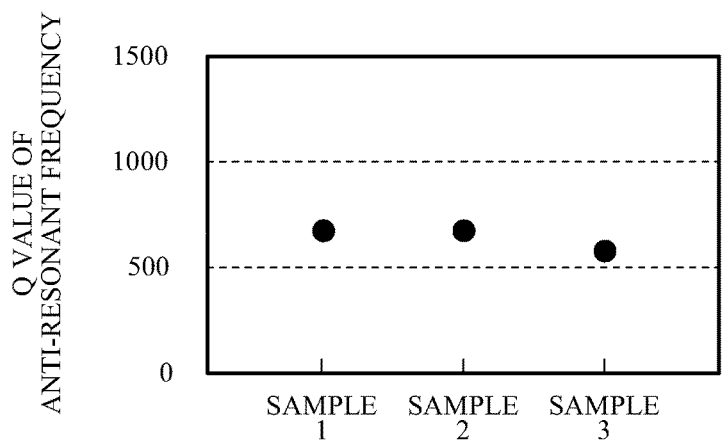
FIG. 5B illustrates simulation results of the Q value of the anti-resonant frequency.
Figure 5C:
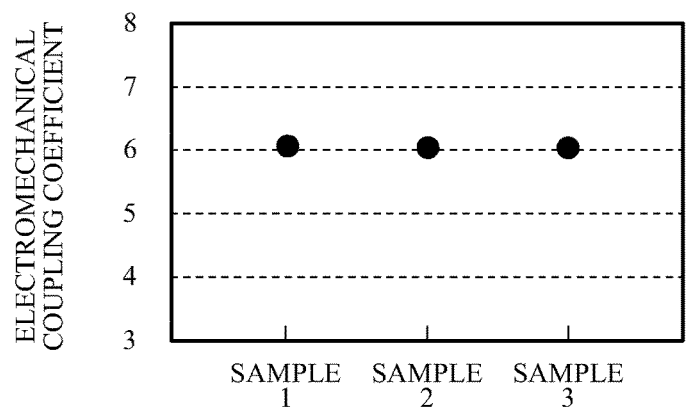
FIG. 5C illustrates simulation results of an electromechanical coupling coefficient.

FIG. 5A illustrates simulation results of the Q value of the resonant frequency, FIG. 5B illustrates simulation results of the Q value of the anti-resonant frequency, and FIG. 5C illustrates simulation results of the electromechanical coupling coefficient. As illustrated in FIG. 5A and FIG. 5B, the sample 1 and the sample 2 including the additional film 12 (the first embodiment) have good Q values of the resonant frequency and the anti-resonant frequency compared to the sample 3 not including the additional film 12 (the second comparative example). The reason why the provision of the additional film 12 results in the good Q value is considered as follows.

That is to say, when the additional film 12 is not provided, the acoustic wave energy is confined between the temperature compensation film 14 and the protective film formed on the upper electrode 20 (not illustrated), and the strength thereof decreases at closer distances to the temperature compensation film 14 and the protective film (not illustrated). Accordingly, the temperature compensation film 14 is located in a part where the acoustic wave energy is low, and the temperature compensation film 14 needs to be thicken to improve temperature characteristics as presented in Table 1. On the other hand, when the additional film 12 is provided, the acoustic wave energy is confined between the additional film 12 and the protective film (not illustrated). Therefore, the temperature compensation film 14 is located in a part where the acoustic wave energy is greater than that of a case where the additional film 12 is not provided, and the thickness of the temperature compensation film 14 to improve the temperature characteristics can be reduced as presented in Table 1. As described above, the provision of the additional film 12 allows the thickness of the temperature compensation film 14 for improving temperature characteristics to be reduced, and thereby, the Q values of the resonant frequency and the anti-resonant frequency are improved in the sample 1 and the sample 2 (the first embodiment). When a temperature compensation film is located in the piezoelectric film as described above, the electromechanical coupling coefficient decreases. However, in the sample 1 and the sample 2 (the first embodiment), the temperature compensation film 14 is located under the lower electrode 16, and thereby a good electromechanical coupling coefficient can be obtained as illustrated in FIG. 5C.

In addition, as illustrated in FIG. 5A through FIG. 5C, the Q values equivalent to each other and the electromechanical coupling coefficients equivalent to each other are obtained between the cases where the additional film 12 is a Ru film (sample 1) and an AlN film (sample 2) when the mass per unit area is made to be the same between both cases.

The piezoelectric thin film resonator of the first embodiment was fabricated, and the Q value of the resonant frequency, the Q value of the anti-resonant frequency, and the electromechanical coupling coefficient were measured. Table 2 presents the materials and the film thicknesses of the layers of the fabricated piezoelectric thin film resonator. The thicknesses of the additional film 12, the temperature compensation film 14, and the lower electrode 16 were adjusted so that fabricated samples 4, 5 had the same temperature characteristics (a temperature coefficient of resonant frequency of approximately −10 ppm/° C.). A protective film was located on the upper electrode 20.

TABLE 2

| | | Protective film | Upper electrode | | Piezoelectric film | Lower electrode | Temperature compensation film | Additional film | |
|---|---|---|---|---|---|---|---|---|---|
| | | SiO$_2$ | Cr | Ru | AlN | Ru | SiOF | Ru | Cr |
| First Embodiment | Sample 4 | 50 | 40 | 210 | 1200 | 160 | 200 | — | 100 |
| | Sample 5 | 50 | 40 | 210 | 1200 | 130 | 135 | 30 | 100 |

UNIT: nm

Figure 6A:
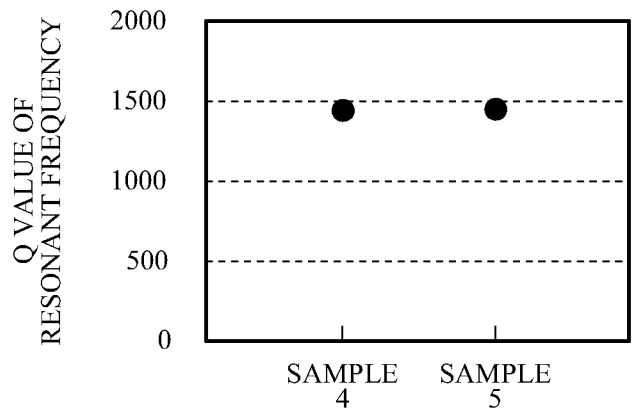
FIG. 6A illustrates measurement results of the Q value of the resonant frequency.
Figure 6B:
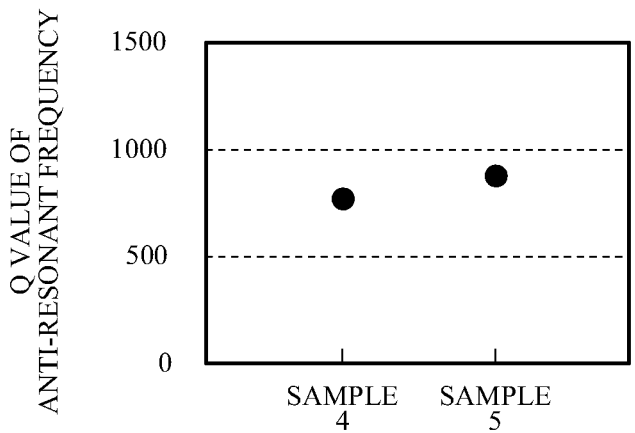
FIG. 6B illustrates measurement results of the Q value of the anti-resonant frequency.
Figure 6C:
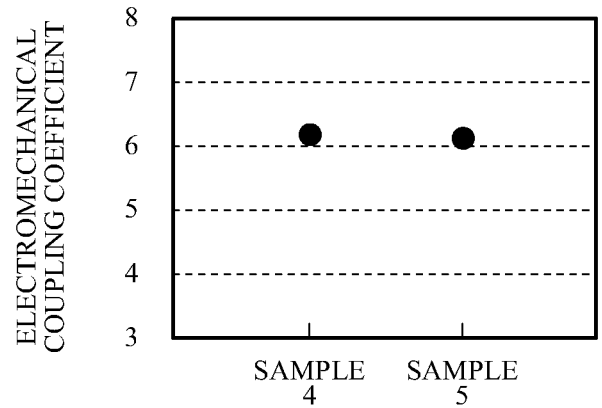
FIG. 6C illustrates measurement results of the electromechanical coupling coefficient.

FIG. 6A illustrates measurement results of the Q value of the resonant frequency, FIG. 6B illustrates measurement results of the Q value of the anti-resonant frequency, and FIG. 6C illustrates measurement results of the electromechanical coupling coefficient. As illustrated in FIG. 6A through FIG. 6C, the sample 4 and the sample 5 (the first embodiment) obtain good results in the Q value of the resonant frequency, the Q value of the anti-resonant frequency, and the electromechanical coupling coefficient. The Q value of the anti-resonant frequency of the sample 5 is greater than that of the sample 4. This is because the sample 4 uses only a Cr film for the additional film 12 while the sample 5 uses a Ru film with an acoustic impedance greater than that of Cr for the additional film 12 in addition to the Cr film and reduces the thickness of the lower electrode 16. This allows the sample 5 to reduce the film thickness of the temperature compensation film 14 to obtain the same temperature characteristics compared to the sample 4 because the temperature compensation film 14 in the sample 5 comes closer to the piezoelectric film 18, and thereby, the Q value of the anti-resonant frequency is improved. As described above, the thickness of the temperature compensation film 14 can be reduced by using a film with a high acoustic impedance for the additional film 12 and reducing the thickness of the lower electrode 16, and thereby the resonance characteristics can be improved.

As described above, the first embodiment locates the temperature compensation film 14 on the surface of the lower electrode 16 opposite to the piezoelectric film 18, and the temperature compensation film 14 has a temperature coefficient of elastic constant opposite in sign to the temperature coefficient of elastic constant of the piezoelectric film 18. This structure allows the reduction in temperature dependence of frequency as illustrated in FIG. 4A and FIG. 4B. In addition, the additional film 12 is located on the surface of the temperature compensation film 14 opposite to the piezoelectric film 18, and the additional film 12 has an acoustic impedance greater than that of the temperature compensation film 14. This structure makes it possible to obtain good resonance characteristics as illustrated in FIG. 5A and FIG. 6C.

As presented in Table 1 and FIG. 5A through FIG. 5C, good resonance characteristics can be obtained not only when the additional film 12 is made of a metal but also when the additional film 12 is made of an insulating material. When the additional film 12 is made of a metal, the additional film 12 may include the same material as the lower electrode 16 and the upper electrode 20. Additionally, when the additional film 12 is made of an insulating material, the additional film 12 may contain the same material as the piezoelectric film 18.

As illustrated in FIG. 1A through FIG. 1C, the temperature compensation film 14 and the additional film 12 are preferably provided so as to cover the resonance region 32 to reduce temperature dependence of frequency. For example, the temperature compensation film 14 and the additional film 12 are preferably provided so as to cover the whole of the resonance region 32. When the temperature compensation film 14 and the additional film 12 are provided so as to cover the resonance region 32, the thickness of the film in the resonance region 32 can be uniform. Thus, the degradation of resonance characteristics disclosed in Japanese Patent Application Publication No. 2006-109472 can be suppressed.

Second Embodiment

Figure 7A:
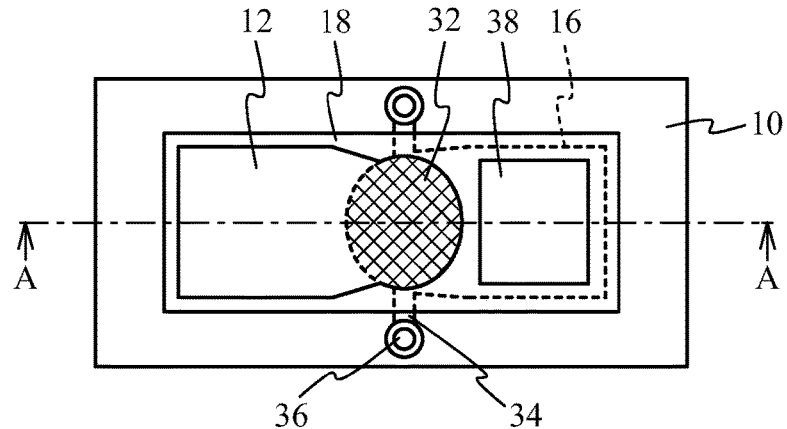
FIG. 7A is a top view illustrating a piezoelectric thin film resonator in accordance with a second embodiment.
Figure 7B:
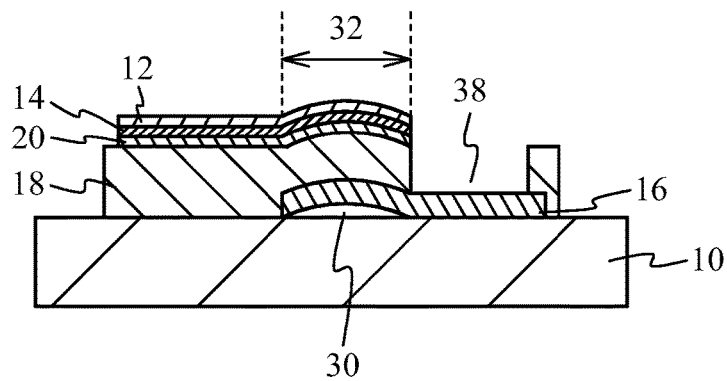
FIG. 7B is a cross-sectional view taken along line A-A in FIG. 7A.
Figure 7C:
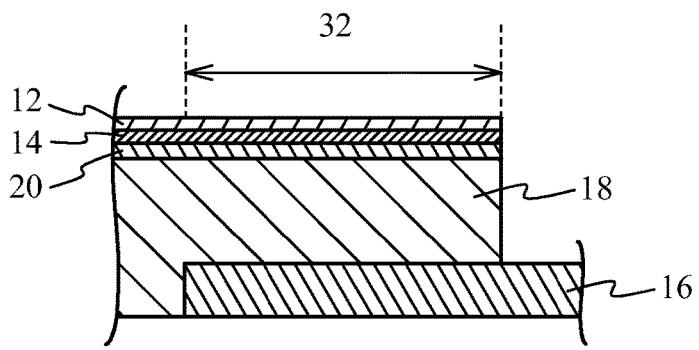
FIG. 7C is an enlarged schematic cross-sectional view of a resonance region.

A second embodiment provides the additional film 12 and the temperature compensation film 14 to the upper electrode 20. FIG. 7A is a top view illustrating a piezoelectric thin film resonator in accordance with the second embodiment, FIG. 7B is a cross-sectional view taken along line A-A in FIG. 7A, and FIG. 7C is an enlarged schematic cross-sectional view of a resonance region. As illustrated in FIG. 7A through FIG. 7C, the temperature compensation film 14 is located on the upper electrode 20, and the additional film 12 is located on the temperature compensation film 14. The upper electrode 20 and the additional film 12 are not short-circuited, and the additional film 12 does not electrically contribute to the excitation of the acoustic wave. Other structures are the same as those illustrated in FIG. 1A through FIG. 1C of the first embodiment, and a description thereof is omitted.

FIG. 8A through FIG. 9C are schematic cross-sectional views illustrating a method of fabricating the piezoelectric thin film resonator in accordance with the second embodiment. In the same manner as the first embodiment, a description will be given of steps of forming the additional film 12, the temperature compensation film 14, the lower electrode 16, the piezoelectric film 18, and the upper electrode 20, and a description of other steps is omitted.

Figure 8A:
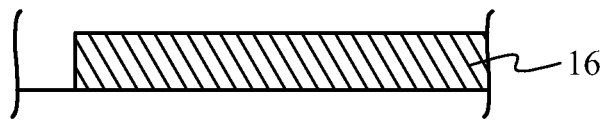
FIG. 8A through FIG. 8D are schematic cross-sectional views (No. 1) illustrating a method of fabricating the piezoelectric thin film resonator in accordance with the second embodiment.
Figure 8B:
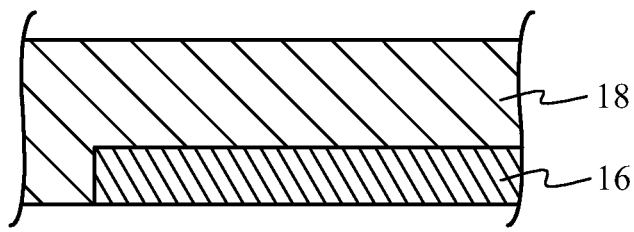
Figure 8C:
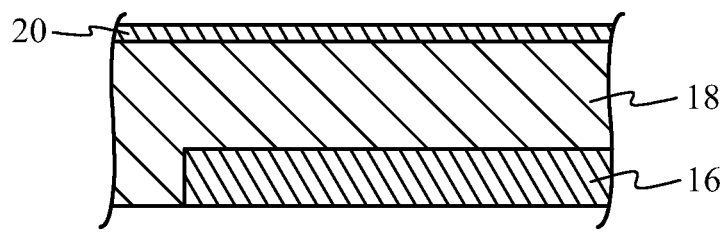
Figure 8D:
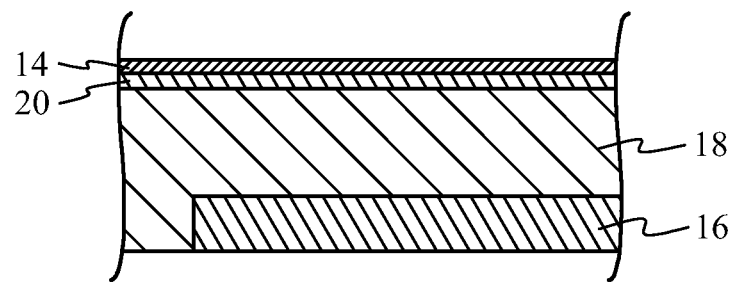

As illustrated in FIG. 8A, the lower electrode 16 is formed on the substrate 10. Then, the lower electrode 16 is patterned into a desired shape by photolithography and etching. As illustrated in FIG. 8B, the piezoelectric film 18 is formed on the lower electrode 16 and the substrate 10. As illustrated in FIG. 8C, the upper electrode 20 is formed on the piezoelectric film 18. As illustrated in FIG. 8D, the temperature compensation film 14 is formed on the upper electrode 20.

Figure 9A:
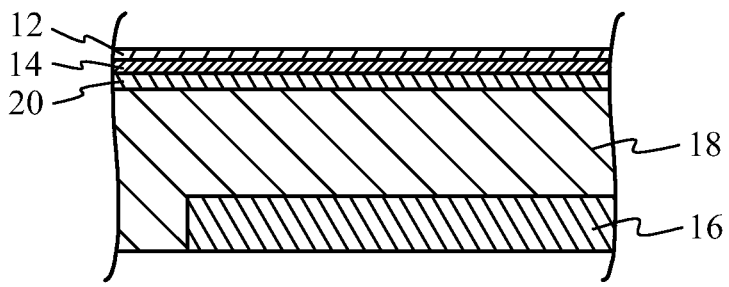
FIG. 9A through FIG. 9C are schematic cross-sectional views (No. 2) illustrating the method of fabricating the piezoelectric thin film resonator in accordance with the second embodiment.
Figure 9B:
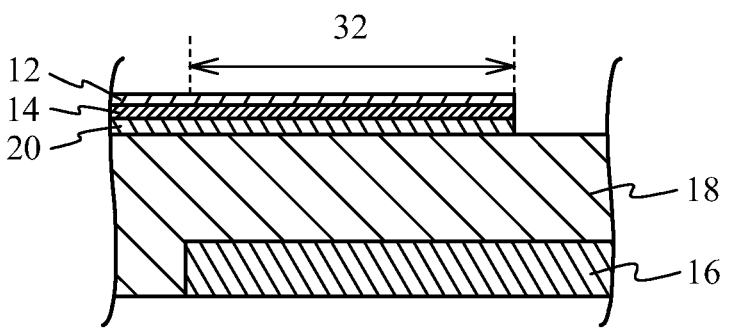
Figure 9C:
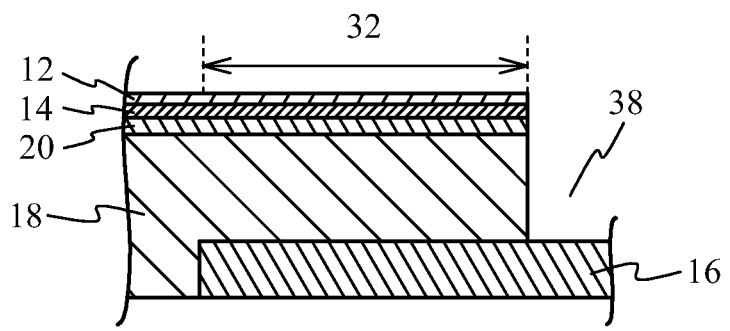

As illustrated in FIG. 9A, the additional film 12 is formed on the temperature compensation film 14. As illustrated in FIG. 9B, the additional film 12, the temperature compensation film 14, and the upper electrode 20 are integrally-patterned into a desired shape by photolithography and etching. This process forms the resonance region 32 in which the lower electrode 16 overlaps with the upper electrode 20. As illustrated in FIG. 9C, the piezoelectric film 18 is etched by using a photoresist (not illustrated) as an etching mask. This process forms the aperture 38 for providing an electrical connection to the lower electrode 16. The additional film 12 may be used as an etching mask.

The piezoelectric thin film resonator of the second embodiment was fabricated, and the Q value of the resonant frequency, the Q value of the anti-resonant frequency, and the electromechanical coupling coefficient were measured. Table 3 presents the materials and the film thicknesses of the layers of the fabricated piezoelectric thin film resonator. The film thicknesses of the additional film 12, the temperature compensation film 14, and the upper electrode 20 were adjusted so that the fabricated samples 6, 7 had the same temperature characteristics (a temperature coefficient of resonant frequency of approximately −15 ppm/° C.). In addition, a protective film was located on the additional film 12.

TABLE 3

|  |  | Protective film | Additional film | | Temperature compensation film | Upper electrode | Piezoelectric film | Lower electrode | |
| --- | --- | --- | --- | --- | --- | --- | --- | --- | --- |
|  |  | $SiO_2$ | Cr | Ru | SiOF | Ru | AlN | Ru | Cr |
| Second Embodiment | Sample 6 | 50 | 40 | 200 | 35 | 20 | 1200 | 160 | 100 |
|  | Sample 7 | 50 | 40 | 50 | 140 | 160 | 1200 | 160 | 100 |

UNIT: nm

Figure 10A:
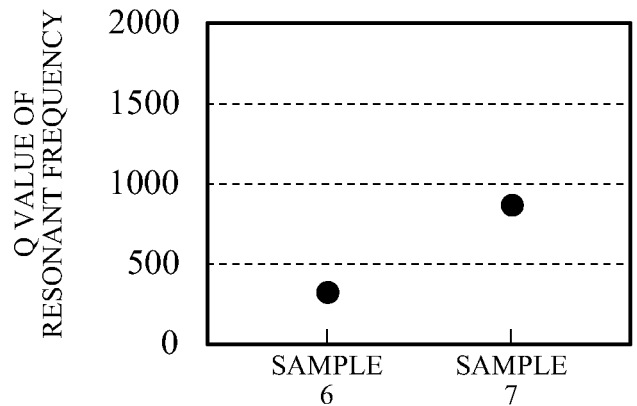
FIG. 10A illustrates measurement results of the Q value of the resonant frequency.
Figure 10B:
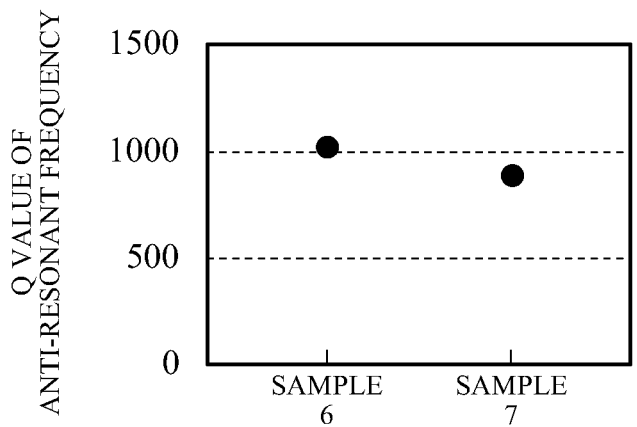
FIG. 10B illustrates measurement results of the Q value of the anti-resonant frequency.
Figure 10C:
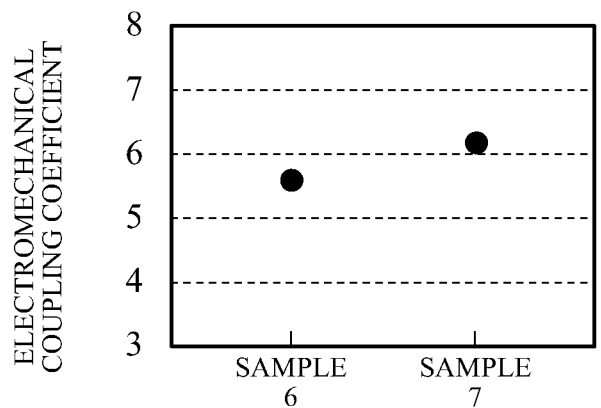
FIG. 10C illustrates measurement results of the electromechanical coupling coefficient.

FIG. 10A illustrates measurement results of the Q value of the resonant frequency, FIG. 10B illustrates measurement results of the Q value of the anti-resonant frequency, and FIG. 10C illustrates measurement results of the electromechanical coupling coefficient. As illustrated in FIG. 10A and FIG. 10C, comparable good results are obtained in the Q value of the anti-resonant frequency and the electromechanical coupling coefficient in both the samples 6, 7. However, the Q value of the resonant frequency of the sample 6 decreases compared to that of the sample 7. The sample 6 reduces the thickness of the upper electrode 20 to make the temperature compensation film 14 closer to the piezoelectric film 18, and thereby reduces the thickness of the temperature compensation film 14 to obtain the same temperature characteristics as the sample 7. However, when the upper electrode 20 is too thin, the electric loss due to resistance increases in the excitation of the acoustic wave, and the Q value of the resonant frequency decreases. Therefore, it is now revealed that when the upper electrode 20 and the additional film 12 contain the same material, the upper electrode 20 preferably has a thickness greater than that of the additional film 12 to improve resonance characteristics. When the mass of the upper electrode 20 is 1, the mass ratio of the additional film 12 is approximately 11 in the sample 6 and approximately 0.5 in the sample 7. This reveals that the resonance characteristics can be improved by making the mass per unit area of the electrode (here, the upper electrode 20) to which the additional film 12 is provided greater than that of the additional film 12.

As described in the second embodiment, the temperature compensation film 14 may be located on the surface of the upper electrode 20 opposite to the piezoelectric film 18, and the additional film 12 may be located on the surface of the temperature compensation film 14 opposite to the piezoelectric film 18. It is sufficient if the temperature compensation film 14 is located on the surface, which is opposite to the piezoelectric film 18, of at least one of the lower electrode 16 and the upper electrode 20, and the additional film 12 is located on the surface of the temperature compensation film 14 opposite to the piezoelectric film 18.

In addition, the results illustrated in FIG. 10A and FIG. 10C reveal that the electrode (the upper electrode 20) to which the additional film 12 is provided preferably has a mass per unit area greater than that of the additional film 12. This makes it possible to obtain better resonance characteristics. The second embodiment describes a case where the additional film 12 is a metal film containing the same material as the upper electrode 20. However, better resonance characteristics can be obtained by meeting the aforementioned condition even when the additional film 12 is made of a metal different from the upper electrode 20 or an insulating material. In addition, when the additional film 12 contains the same material as the upper electrode 20, the upper electrode 20 preferably has a thickness greater than that of the additional film 12 to obtain good resonance characteristics.

Also in the second embodiment, the additional film 12, the temperature compensation film 14, and the upper electrode 20 are integrally-formed to simplify the production, and thus have the same shape. That is to say, the additional film 12 and the temperature compensation film 14 are provided so as to cover the resonance region 32 in the same manner as the first embodiment.

Third Embodiment

Figure 11A:
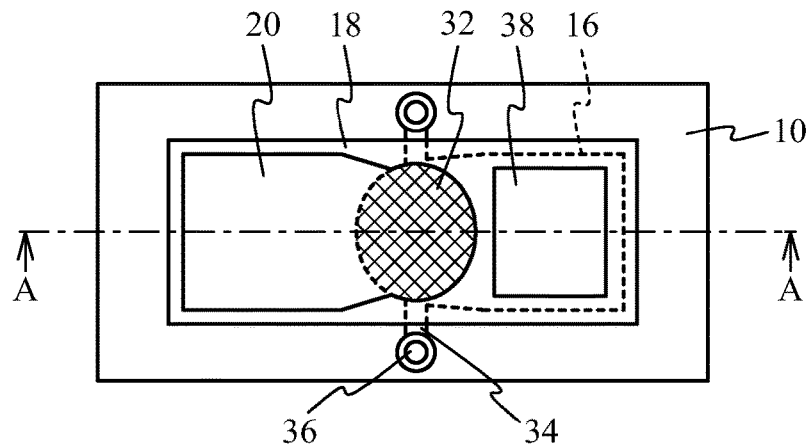
FIG. 11A is a top view illustrating a piezoelectric thin film resonator in accordance with a third embodiment.
Figure 11B:
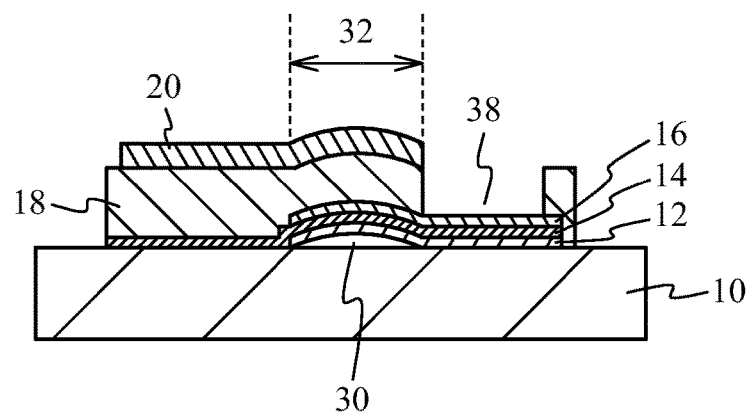
FIG. 11B is a cross-sectional view taken along line A-A in FIG. 11A.
Figure 11C:
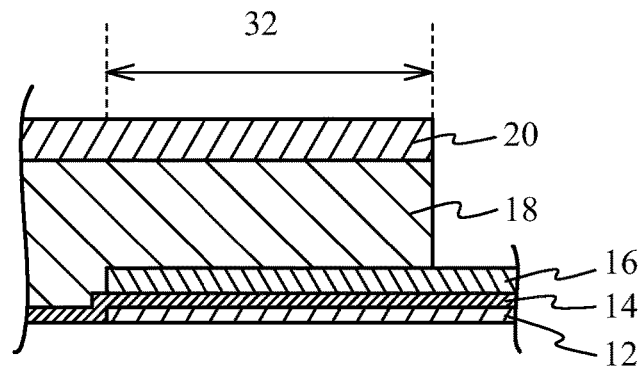
FIG. 11C is an enlarged schematic cross-sectional view of a resonance region.

FIG. 11A is a top view illustrating a piezoelectric thin film resonator in accordance with a third embodiment, FIG. 11B is a cross-sectional view taken along line A-A in FIG. 11A, and FIG. 11C is an enlarged schematic cross-sectional view of a resonance region. As illustrated in FIG. 11A through FIG. 11C, the temperature compensation film 14 located on the lower surface of the lower electrode 16 extends from the resonance region 32 so as to cover the lower surface of the piezoelectric film 18. For example, the temperature compensation film 14 extends so as to cover at least the whole of the lower surface of the piezoelectric film 18. Other structures are the same as those illustrated in FIG. 1A through FIG. 1C of the first embodiment, and a description thereof is omitted. The additional film 12 is patterned into the same shape as the lower electrode 16, but may extend so as to cover the lower surface of the piezoelectric film 18 as the temperature compensation film 14 does.

FIG. 12A through FIG. 13D are schematic cross-sectional views illustrating a method of fabricating the piezoelectric thin film resonator in accordance with the third embodiment. As with the first embodiment, a description will be given of steps of forming the additional film 12, the temperature compensation film 14, the lower electrode 16, the piezoelectric film 18, and the upper electrode 20, and a description of other steps is omitted.

Figure 12A:
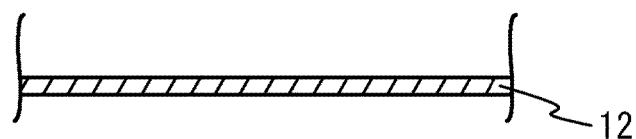
FIG. 12A through FIG. 12D are schematic cross-sectional views (No. 1) illustrating a method of fabricating the piezoelectric thin film resonator in accordance with the third embodiment.
Figure 12B:
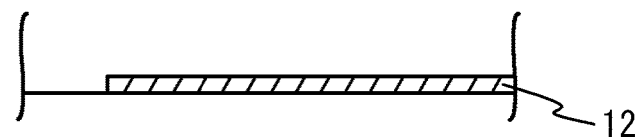
Figure 12C:
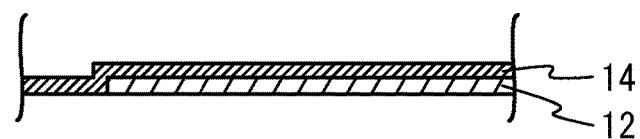
Figure 12D:
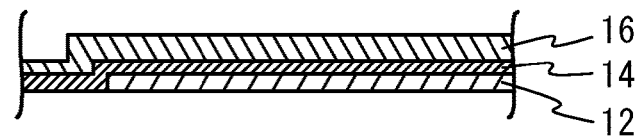

As illustrated in FIG. 12A, the additional film 12 is formed on the substrate 10. As illustrated in FIG. 12B, the additional film 12 is patterned into a desired shape by photolithography and etching. As illustrated in FIG. 12C, the temperature compensation film 14 is formed on the additional film 12 and the substrate 10. As illustrated in FIG. 12D, the lower electrode 16 is formed on the temperature compensation film 14.

Figure 13A:
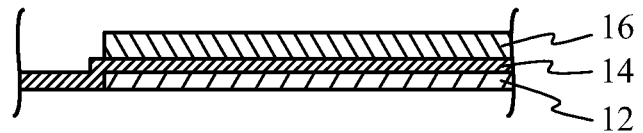
FIG. 13A through FIG. 13D are schematic cross-sectional views (No. 2) illustrating the method of fabricating the piezoelectric thin film resonator in accordance with the third embodiment.
Figure 13B:
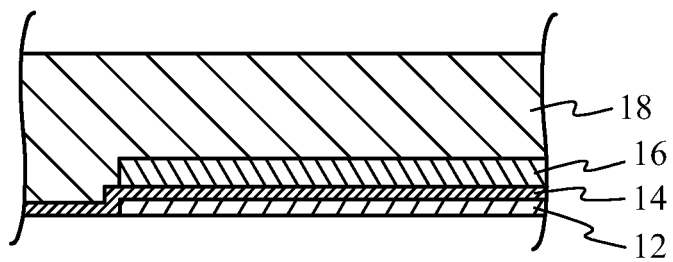
Figure 13C:
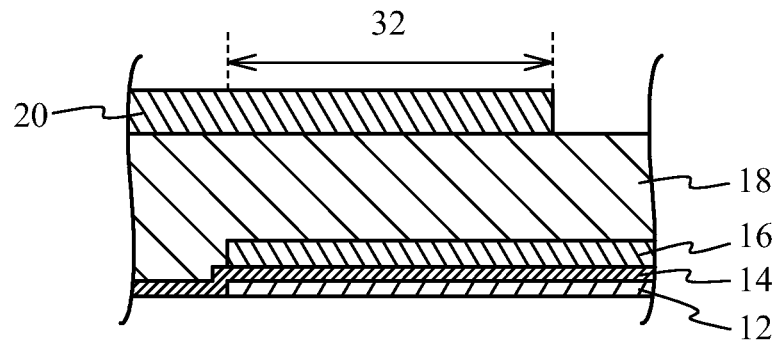
Figure 13D:
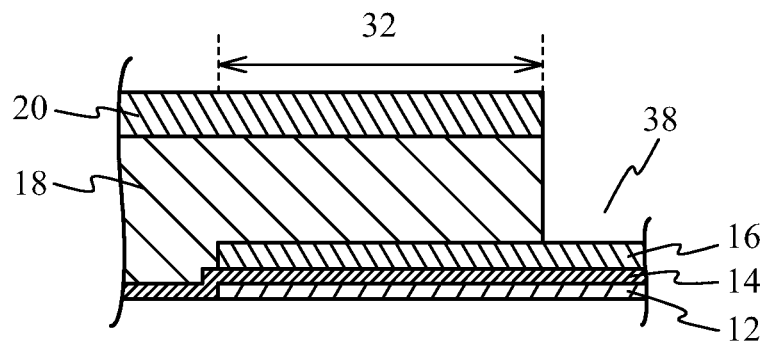

As illustrated in FIG. 13A, the lower electrode 16 is patterned into a desired shape by photolithography and etching. As illustrated in FIG. 13B, the piezoelectric film 18 is formed on the lower electrode 16 and the temperature compensation film 14. As illustrated in FIG. 13C, the upper electrode 20 is formed on the piezoelectric film 18. Then, the upper electrode 20 is patterned into a desired shape by photolithography and etching. This process forms the resonance region 32 in which the lower electrode 16 overlaps with the upper electrode 20. As illustrated in FIG. 13D, the piezoelectric film 18 is etched by using a photoresist (not illustrated) as an etching mask. This process forms the aperture 38 for providing an electrical connection to the lower electrode 16.

In the third embodiment, the temperature compensation film 14 is located on the surface of the lower electrode 16 opposite to the piezoelectric film 18, and extends from the resonance region 32 so as to cover the lower surface of the piezoelectric film 18. This structure protects the lower surface of the piezoelectric film 18 by the temperature compensation film 14, and can suppress the damage inflicted on the piezoelectric film 18 during the fabrication process or after the device is completed, and thus can improve the reliability.

Fourth Embodiment

Figure 14A:
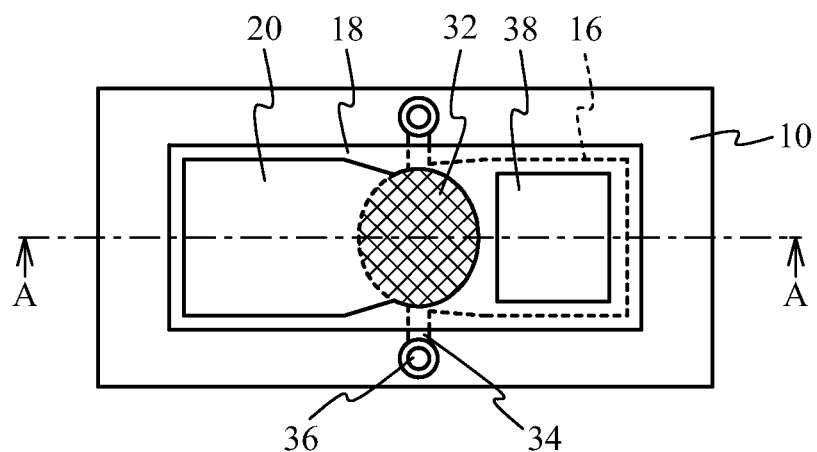
FIG. 14A is a top view illustrating a piezoelectric thin film resonator in accordance with a fourth embodiment.
Figure 14B:
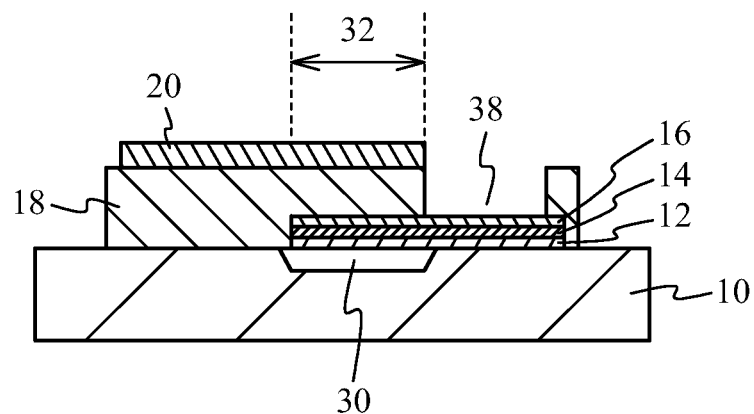
FIG. 14B is a cross-sectional view taken along line A-A in FIG. 14A.

A fourth embodiment changes a structure of the air-space. FIG. 14A is a top view illustrating a piezoelectric thin film resonator in accordance with the fourth embodiment, and FIG. 14B is a cross-sectional view taken along line A-A in FIG. 14A. As illustrated in FIG. 14A and FIG. 14B, a recessed portion is formed in the upper surface of the substrate 10. The additional film 12, the temperature compensation film 14, and the lower electrode 16 are flatly formed on the substrate 10. This structure allows the recessed portion of the substrate 10 to function as the air-space 30. The air-space 30 is formed in the resonance region 32. Other structures are the same as those illustrated in FIG. 1A through FIG. 1C of the first embodiment, and a description is omitted. The air-space 30 may be formed so as to penetrate through the substrate 10.

Fifth Embodiment

Figure 15A:
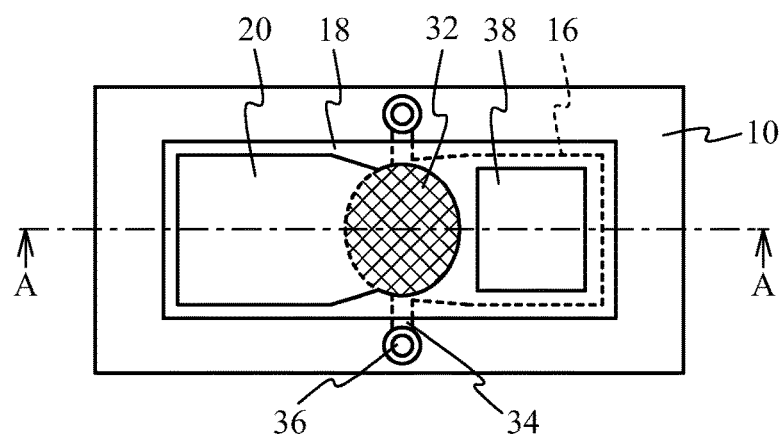
FIG. 15A is a top view illustrating a piezoelectric thin film resonator in accordance with a fifth embodiment.
Figure 15B:
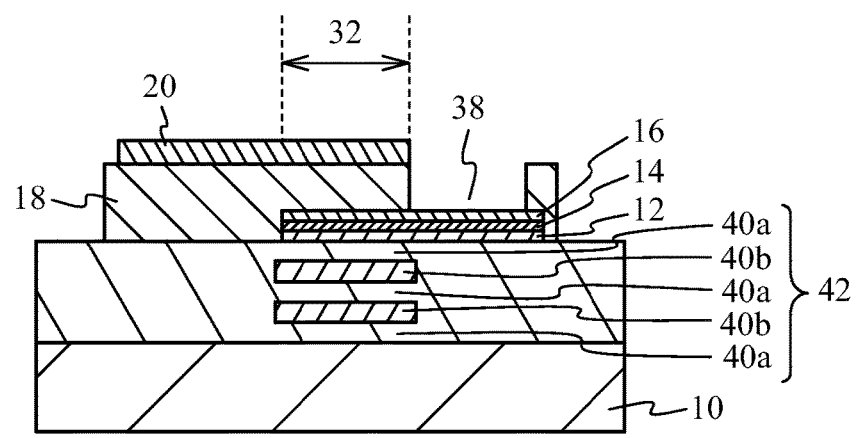
FIG. 15B is a cross-sectional view taken along line A-A in FIG. 15A.

A fifth embodiment provides an acoustic reflection film instead of the air-space. FIG. 15A is a top view illustrating a piezoelectric thin film resonator in accordance with the fifth embodiment, and FIG. 15B is a cross-sectional view taken along line A-A in FIG. 15A. As illustrated in FIG. 15A and FIG. 15B, an acoustic reflection film 42 is located on the lower surface of the additional film 12 in the resonance region 32. The acoustic reflection film 42 is a film reflecting the acoustic wave propagating through the piezoelectric film 18, and is formed by alternately stacking a film 40a with a low acoustic impedance and a film 40b with a high acoustic impedance. The film 40a with a low acoustic impedance and the film 40b with a high acoustic impedance have film thicknesses of approximately $\lambda/4$ ($\lambda$ is the wavelength of the acoustic wave). The number of stacked films 40a with a low acoustic impedance and stacked films 40b with a high acoustic impedance can be arbitrarily determined. The additional film 12 and the temperature compensation film 14 have film thicknesses sufficiently less than $\lambda/4$, and thus do not function as the acoustic reflection film. Other structures are the same as those illustrated in FIG. 1A through FIG. 1C of the first embodiment, and a description thereof is omitted.

As described above, the piezoelectric thin film resonator may have an FBAR structure in which the air-space 30 is located below the lower electrode 16 in the resonance region 32 as described in the first through fourth embodiments. As described in the fifth embodiment, the piezoelectric thin film resonator may have an SMR (Solidly Mounted Resonator) structure in which the acoustic reflection film 42 is located below the lower electrode 16 in the resonance region 32. In addition, in the fourth and fifth embodiments, the temperature compensation film 14 is located on the lower surface of the lower electrode 16 and the additional film 12 is located on the lower surface of the temperature compensation film 14 as in the first embodiment. However, the temperature compensation film 14 may be located on the upper surface of the upper electrode 20 and the additional film 12 may be located on the upper surface of the temperature compensation film 14 as in the second embodiment. In addition, the temperature compensation film 14 located on the lower surface of the lower electrode 16 may cover the lower surface of the piezoelectric film 18 in the same manner as the third embodiment.

Sixth Embodiment

Figure 16:
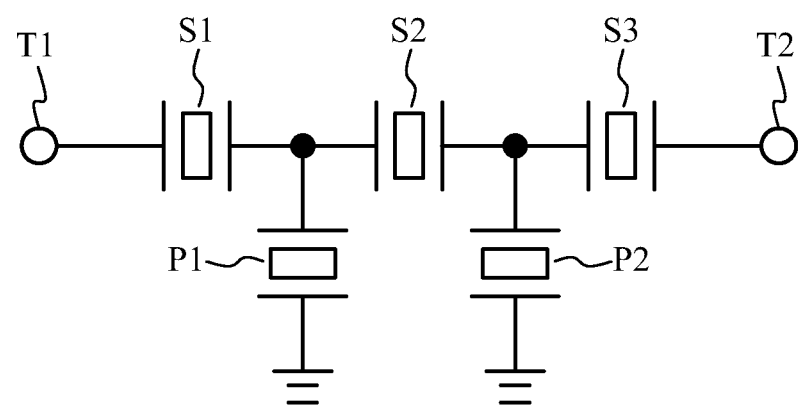
FIG. 16 is a circuit diagram illustrating a ladder-type filter in accordance with a sixth embodiment.

A sixth embodiment uses the piezoelectric thin film resonator of one of the first through fifth embodiments for a filter. FIG. 16 is a circuit diagram illustrating a ladder-type filter in accordance with the sixth embodiment. As illustrated in FIG. 6, the ladder-type filter includes one or more series resonators S1~S3 and one or more parallel resonators P1~P2. The series resonators S1~S3 are connected in series between input/output terminals T1 and T2. The parallel resonators P1~P2 are connected in parallel between the input/output terminals T1 and T2. At least one of the series resonators S1~S3 and the parallel resonators P1~P2 can be any one of the piezoelectric thin film resonators described in the first embodiment through the fifth embodiments.

The series resonator can have a different resonant frequency from the parallel resonator by changing the film thickness of the upper electrode for example. In addition, a mass load film to separately control the resonant frequency of each resonator may be provided. Furthermore, a frequency adjusting film to simultaneously adjust the resonant frequencies of the series resonator and the parallel resonator may be located on the upper electrode including at least the resonance region. The frequency adjusting film may be formed of an insulating layer for example.

Although the embodiments of the present invention have been described in detail, it is to be understood that the various change, substitutions, and alterations could be made hereto without departing from the spirit and scope of the invention.

What is claimed is:

1. An acoustic wave device comprising:
   a piezoelectric film located on a substrate;
   a lower electrode and an upper electrode facing each other across the piezoelectric film;
   a temperature compensation film located on a first surface of the lower electrode in a resonance region in which the lower electrode and the upper electrode sandwich the piezoelectric film and face each other, and having a temperature coefficient of elastic constant opposite in sign to a temperature coefficient of elastic constant of the piezoelectric film, said first surface of the lower electrode being a surface that faces away from the piezoelectric film; and
   an additional film located on a first surface of the temperature compensation film in the resonance region, and having an acoustic impedance greater than an acoustic impedance of the temperature compensation film, said first surface of the temperature compensation film being a surface that faces away from the piezoelectric film,
   wherein:
   the lower electrode is located between the piezoelectric film and the temperature compensation film,
   the temperature compensation film is located between the lower electrode and the additional film,
   the temperature compensation film is an insulating film,
   the additional film is not contact with the lower electrode,
   an air-space is located below the additional film in the resonance region, and
   the additional film is made of a metal material.

2. The acoustic wave device according to claim 1, wherein a mass per unit of the lower electrode is greater than a mass per unit of the additional film.

3. The acoustic wave device according to claim 1, wherein the additional film contains a same material as the lower electrode and the upper electrode.

4. The acoustic wave device according to claim 3, wherein the lower electrode has a thickness greater than a thickness of the additional film.

5. The acoustic wave device according to claim 1, wherein the temperature compensation film and the additional film are located so as to cover the resonance region.

6. The acoustic wave device according to claim 5, wherein the temperature compensation film extends from the resonance region so as to cover a lower surface of the piezoelectric film.

7. The acoustic wave device according to claim 1, wherein the insulating film mainly containing silicon oxide, silicon nitride, or germanium oxide.

8. The acoustic wave device according to claim 1, wherein the piezoelectric film mainly contains aluminum nitride.

9. The acoustic wave device according to claim 1, wherein the additional film is not electrically connected to the lower electrode and the upper electrode.

10. The acoustic wave device according to claim 1, wherein
the lower electrode, the temperature compensation and the additional film have a same shape.

11. An acoustic wave device comprising:
a piezoelectric film located on a substrate;
a lower electrode and an upper electrode facing each other across the piezoelectric film;
a temperature compensation film located on a first surface of the upper electrode in a resonance region in which the lower electrode and the upper electrode sandwich the piezoelectric film and face each other, and having a temperature coefficient of elastic constant opposite in sign to a temperature coefficient of elastic constant of the piezoelectric film, said first surface of the upper electrode being a surface that faces away from the piezoelectric film; and
an additional film located on a first surface of the temperature compensation film in the resonance region, and having an acoustic impedance greater than an acoustic impedance of the temperature compensation film, said first surface of the temperature compensation film being a surface that faces away from the piezoelectric film, wherein:

the upper electrode is located between the piezoelectric film and the temperature compensation film, the temperature compensation film is located between the upper electrode and the additional film, the temperature compensation film is an insulating film, and the additional film is made of a metal material and is not contact with the upper electrode.

* * * * *